United States Patent
Fujita et al.

(10) Patent No.: US 10,998,436 B2
(45) Date of Patent: May 4, 2021

(54) SEMICONDUCTOR DEVICE

(71) Applicant: Mitsubishi Electric Corporation, Chiyoda-ku (JP)

(72) Inventors: Jun Fujita, Chiyoda-ku (JP); Naoto Kaguchi, Chiyoda-ku (JP); Fumio Wada, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/480,945

(22) PCT Filed: Mar. 16, 2017

(86) PCT No.: PCT/JP2017/010743
§ 371 (c)(1),
(2) Date: Jul. 25, 2019

(87) PCT Pub. No.: WO2018/167925
PCT Pub. Date: Sep. 20, 2018

(65) Prior Publication Data
US 2019/0393333 A1    Dec. 26, 2019

(51) Int. Cl.
*H01L 29/78* (2006.01)
*H01L 21/288* (2006.01)
(Continued)

(52) U.S. Cl.
CPC ............ *H01L 29/78* (2013.01); *H01L 21/288* (2013.01); *H01L 21/3213* (2013.01);
(Continued)

(58) Field of Classification Search
CPC combination set(s) only.
See application file for complete search history.

(56) References Cited

U.S. PATENT DOCUMENTS

2010/0197127 A1* 8/2010 Urano .................. H01L 21/288
438/584
2010/0240213 A1* 9/2010 Urano ............... H01L 29/66712
438/652
(Continued)

FOREIGN PATENT DOCUMENTS

JP    2003-101024 A    4/2003
JP    2010-182807 A    8/2010
(Continued)

OTHER PUBLICATIONS

International Search Report dated May 9, 2017 in PCT/JP2017/010743 filed Mar. 16, 2017.

*Primary Examiner* — Laura M Menz
*Assistant Examiner* — Khatib A Rahman
(74) *Attorney, Agent, or Firm* — Xsensus LLP

(57) ABSTRACT

A semiconductor device having high reliability is obtained. A semiconductor device includes a semiconductor substrate, a first gate interconnection, a second gate interconnection, a first metal portion, an insulating member, and a second metal portion. The first gate interconnection and the second gate interconnection are disposed on a main surface of the semiconductor substrate with an interval therebetween. The first metal portion is formed on the first gate interconnection and the second gate interconnection. The first metal portion has a top surface located opposite to the semiconductor substrate at a region between the first gate interconnection and the second gate interconnection. A recess is formed in the top surface. The insulating member fills at least a portion of the recess. The second metal portion extends from an upper surface of the insulating member onto the top surface of the first metal portion.

11 Claims, 10 Drawing Sheets

(51) Int. Cl.
*H01L 21/3213* (2006.01)
*H01L 23/00* (2006.01)
*H01L 29/45* (2006.01)
*H01L 29/66* (2006.01)
*H01L 29/739* (2006.01)

(52) U.S. Cl.
CPC ............ *H01L 24/32* (2013.01); *H01L 29/456* (2013.01); *H01L 29/66348* (2013.01); *H01L 29/7397* (2013.01); *H01L 2224/32245* (2013.01); *H01L 2924/13091* (2013.01)

(56) References Cited

U.S. PATENT DOCUMENTS

2010/0291767 A1* 11/2010 Miura ............... H01L 29/66734
438/653
2011/0227150 A1* 9/2011 Horita ................. H01L 29/7397
257/330

FOREIGN PATENT DOCUMENTS

| JP | 2010-251719 A | 11/2010 |
| JP | 2011-199060 A | 10/2011 |
| JP | 5707709 B2 | 4/2015 |

* cited by examiner

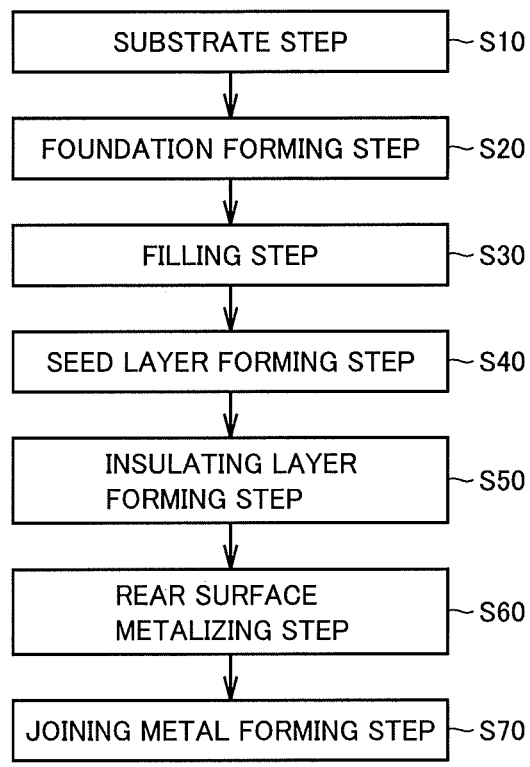
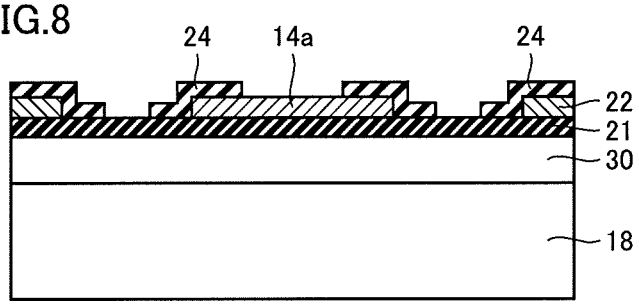

SEMICONDUCTOR DEVICE

TECHNICAL FIELD

The present invention relates to a semiconductor device, particularly, a power semiconductor device.

BACKGROUND ART

As a power semiconductor device for power control, a vertical type MOSFET (Metal Oxide Semiconductor Field Effect Transistor), an IGBT (Insulated Gate Bipolar Transistor), or the like has been generally known. For example, the vertical type MOSFET has a source electrode, a gate electrode, and a drain electrode. The source electrode and the gate electrode are formed on a front surface of a substrate. The drain electrode is formed on a rear surface of the substrate. In the vertical type MOSFET, current flowing between the source electrode and the drain electrode is controlled by turning on or off a signal applied to the gate electrode.

The source electrode, the gate electrode, and the drain electrode are composed of various types of metal materials in accordance with a mounting configuration as a semiconductor module. For example, when the vertical type MOSFET is formed into a module through joining using a solder or a sintered metal such as nano silver particles, a nickel (Ni)/gold (Au) film is formed by a deposition method or an electroless plating method on each of the source electrode, the gate electrode, and the drain electrode, each of which is composed of an aluminum (Al)-based material.

At the front surface side of the substrate at which the above-described MOSFET or the like is formed, a cell structure including the source electrode, the gate electrode, and the like is formed. Accordingly, the front surface side of the substrate has a structure with a large level difference. On the other hand, no cell structure is formed at the rear surface side of the substrate. Hence, the rear surface side of the substrate is flat as compared with the front surface side. Accordingly, an optimal film formation condition for forming the source electrode and the gate electrode on the front surface of the substrate and an optimal film formation condition for forming the drain electrode on the rear surface of the substrate are different from each other even when the same aluminum (Al)-based material is used to form them. As a result, the film quality of each of the source electrode and the gate electrode becomes different from the film quality of the drain electrode.

When forming an electroless Ni plating layer on a surface of the Al-based material as a joining metal layer, the surface of the Al-based material is subjected to a pre-process such as an etching process or a zincate process before the electroless Ni plating in order to remove an oxide film from the surface of the material to improve adhesion of the plating layer. In such a pre-process step, a low-density portion of the Al-based material is etched faster than a high-density portion of the Al-based material, with the result that a defect called "aluminum pitting corrosion" may be formed. The aluminum pitting corrosion refers to a hole having a narrow entrance, a long depth, and a large internal space. An alkali metal originated from a plating liquid and remaining in the aluminum pitting corrosion is diffused to a gate oxide film and a gate interconnection due to a heat treatment or the like in a mounting step, with the result that device properties are varied, disadvantageously.

In order to address such a problem, a structure described in Patent Literature 1 (Japanese Patent Laying-Open No. 2010-251719) has been proposed, for example. A semiconductor device described in Patent Literature 1 has an Al electrode formed at the front surface side of a substrate. On the Al electrode at the front surface side of the substrate, a Ni film is formed by a sputtering method. On the Ni film formed by the sputtering method, a Ni film is formed by the electroless plating method.

In Patent Literature 1, a manufacturing method has been proposed by which an electroless nickel plating film can be deposited without performing the etching process and the zincate process of the electroless nickel plating pre-process step that causes formation of the aluminum pitting corrosion. In this way, after forming the nickel film on the aluminum electrode, electroless nickel plating is deposited on the nickel layer only by a surface activation process for the nickel surface. In this case, the above-described aluminum pitting corrosion is not formed.

CITATION LIST

Patent Literature

PTL 1: Japanese Patent Laying-Open No. 2010-251719

SUMMARY OF INVENTION

Technical Problem

According to the description of Patent Literature 1, when forming the Ni film on the Al electrode, the Ni film is formed by sputtering. Moreover, in the semiconductor device illustrated in FIG. 1 of Patent Literature 1, a recess is formed in the Al electrode formed on gate interconnections, at a region between the two gate interconnections. The recess has side walls that form such a shape that the width of the recess becomes wider in an upward direction, i.e., form a so-called forward tapered shape. However, due to manufacturing variations, the side walls of the recess do not necessarily form such a forward tapered shape. Moreover, it is considered that depending on a device structure, the side walls of the recess may be perpendicular to the main surface of the substrate or may form a reverse tapered shape. In such a case, the Ni film to be formed on the Al electrode may be formed only on the bottom portion of the recess, the upper surface of the Al film, and a vicinity of the upper opening of the recess. As a result, the electroless nickel plating film formed on the Ni film fails to fill the recess of the Al electrode, with the result that a cavity (void) is formed in the recess.

In such a cavity, a plating liquid used to form the electroless nickel plating film may remain. Moreover, due to thermal histories in manufacturing and operation of the semiconductor device, a crack from the cavity may be generated to extend to the Al electrode. Moreover, an alkali metal component originated from the plating liquid remaining in the cavity may be diffused into the device (for example, the Al electrode or the gate electrode) via the crack, thus resulting in varied device properties.

The present disclosure has been made to solve the foregoing problem and has an object to provide a semiconductor device having high reliability.

Solution To Problem

A semiconductor device according to the present disclosure includes a semiconductor substrate having a main surface, a first gate interconnection, a second gate interconnection, a first metal portion, an insulating member, and a second metal portion. The first gate interconnection and the second gate interconnection are disposed on the main surface of the semiconductor substrate with an interval between the first gate interconnection and the second gate interconnection. The first metal portion is formed on the first gate interconnection and the second gate interconnection. The first metal portion has a top surface located opposite to the semiconductor substrate at a region between the first gate interconnection and the second gate interconnection. A recess is formed in the top surface. The insulating member fills at least a portion of the recess. The second metal portion extends from an upper surface of the insulating member onto the top surface of the first metal portion.

Advantageous Effects of Invention

According to the present disclosure, since the insulating member is disposed to fill at least a portion of the recess, the depth of the recess from the upper opening thereof can be shallow, with the result that the second metal portion can extend without interruption from the upper surface of the insulating member in the recess onto the top surface of the first metal portion. Accordingly, when forming a metal film on the metal portion, occurrence of a defect such as a void in the metal film can be suppressed, whereby a semiconductor device having high reliability can be obtained.

BRIEF DESCRIPTION OF DRAWINGS

FIG. 7 is flowchart for illustrating a method for manufacturing the semiconductor device according to the first embodiment of the present invention.

FIG. 8 is a schematic cross sectional view for illustrating the method for manufacturing the semiconductor device according to the first embodiment of the present invention.

DESCRIPTION OF EMBODIMENTS

Figure 1:
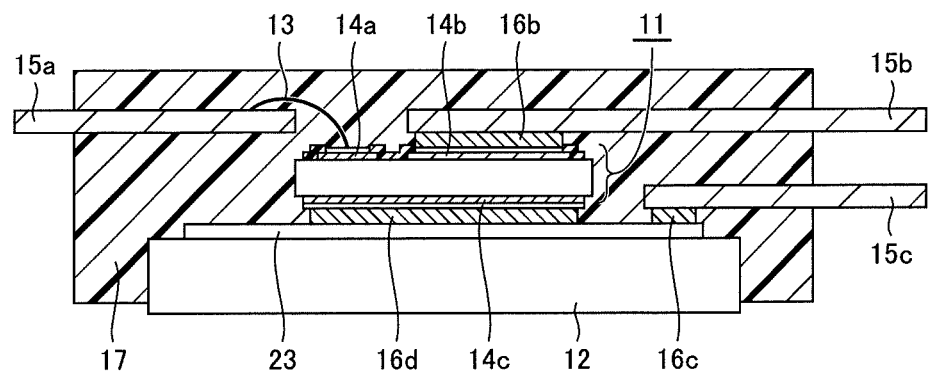
FIG. 1 is a schematic cross sectional view of a semiconductor module including a semiconductor device according to a first embodiment of the present invention.

In the following, an embodiment of the present invention will be described with reference to figures. In the below-described figures, the same or corresponding portions are given the same reference characters and are not described repeatedly. Moreover, in the below-described figures inclusive of FIG. 1, a relation between respective sizes of components may be different from an actual relation therebetween. Further, embodiments of the components described in the entire specification are just exemplary and should not be limited to these descriptions.

First Embodiment

<Configurations of Semiconductor Device and Semiconductor Module>

Figure 2:
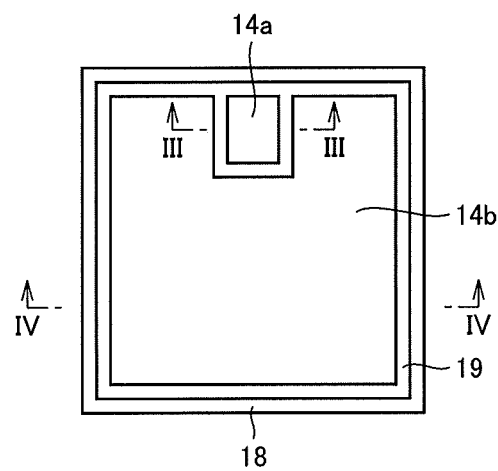
FIG. 2 is a schematic plan view showing front electrodes of the semiconductor device according to the first embodiment of the present invention.
Figure 3:
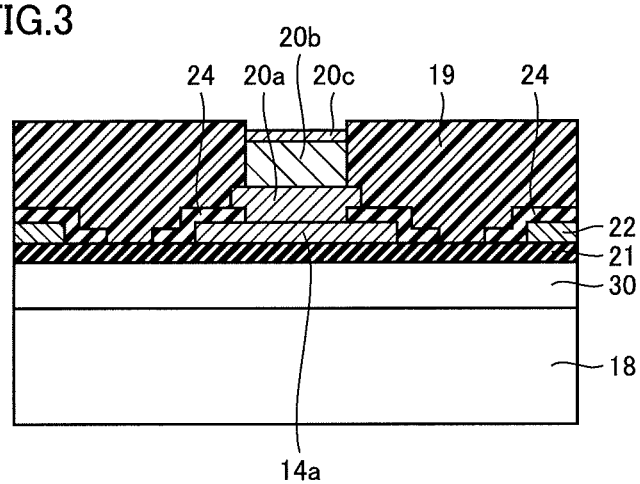
FIG. 3 is a schematic cross sectional view taken along a line segment of FIG. 2.
Figure 4:
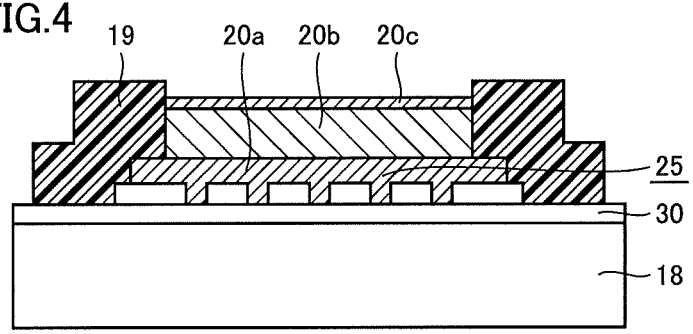
FIG. 4 is a schematic cross sectional view taken along a line segment IV-IV of FIG. 2.
Figure 5:
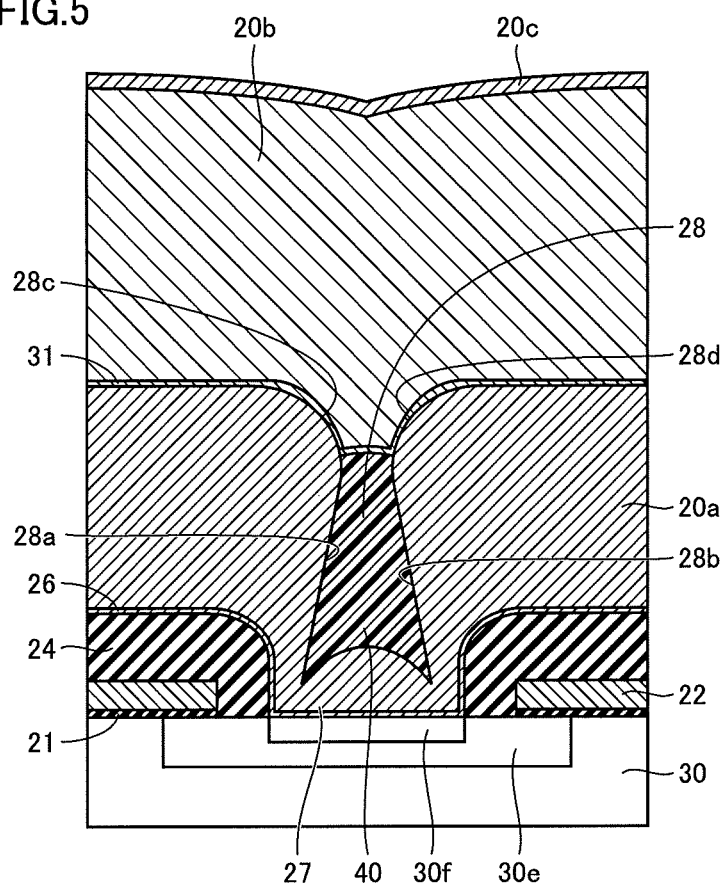
FIG. 5 is an enlarged schematic cross sectional view of a cell portion including the front electrodes of the semiconductor device shown in FIG. 4.
Figure 6:
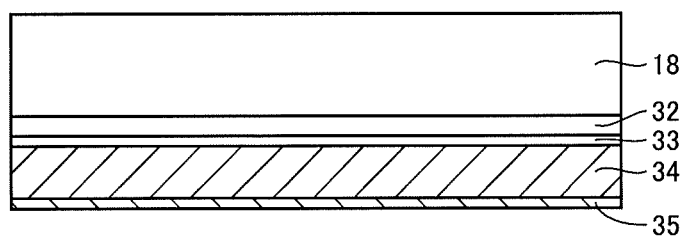
FIG. 6 is an enlarged schematic cross sectional view including a rear electrode of the semiconductor device according to the first embodiment of the present invention.

FIG. 1 is a schematic cross sectional view of a semiconductor module including a semiconductor element serving as a semiconductor device according to a first embodiment of the present invention. FIG. 2 is a schematic plan view showing front electrodes of semiconductor element 11 shown in FIG. 1 according to the first embodiment of the present invention. FIG. 3 is a schematic cross sectional view taken along a line segment III-III of FIG. 2. FIG. 4 is a schematic cross sectional view taken along a line segment IV-IV of FIG. 2. FIG. 5 is an enlarged schematic cross sectional view of a cell portion including the front electrodes of semiconductor element 11 shown in FIG. 4. FIG. 6 is an enlarged schematic cross sectional view including a rear electrode of semiconductor element 11 according to the first embodiment of the present invention. With reference to FIG. 1 to FIG. 6, the following describes configurations of the semiconductor device and the semiconductor module according to the present embodiment.

As shown in FIG. 1, semiconductor module 10 according to the first embodiment of the present invention mainly includes: semiconductor element 11 serving as the semiconductor device; a base plate 12; a wire 13; withdrawn conductors 15a to 15c; joining materials 16b to 16d; and a sealing resin 17.

Base plate 12 is composed of an insulating material, and has a front surface on which an interconnection pattern 23 composed of a metal is formed, for example. Semiconductor element 11 is disposed on interconnection pattern 23 formed on the top surface of base plate 12. Semiconductor element 11 may be a trench gate type MOSFET or an IGBT, for example. Here, the description is directed to a case where a vertical type MOSFET or the like is used as semiconductor element 11.

As shown in FIG. 1 to FIG. 4, in semiconductor element 11, a gate electrode 14a serving as a control electrode and a source electrode 14b in which a large amount of current flows are formed at the top surface (front surface) side of a semiconductor substrate 18. Moreover, as shown in FIG. 1 and FIG. 6, a drain electrode 14c is formed on the lower surface (rear surface) of semiconductor substrate 18 of semiconductor element 11. A large amount of current flows between drain electrode 14c and source electrode 14b in a thickness direction.

Each of gate electrode 14a and source electrode 14b is composed of a material including more than or equal to 95 wt % of aluminum (Al). Drain electrode 14c include one or both of the following materials: a material including more than or equal to 95 wt % of aluminum as with source electrode 14b; and a material including more than or equal to 90 wt % of nickel (Ni).

Layered metal films are formed on a surface of source electrode 14b and a surface of drain electrode 14c so as to secure joining with solders represented by joining materials 16b, 16d. Examples of each of such layered metal films include a nickel/gold plating film formed by the electroless plating method. Generally, the same process is performed for electrodes on the same plane. Therefore, the same layered metal film as the layered metal film formed on the surface of source electrode 14b is also formed on the surface of gate electrode 14a.

Gate electrode 14a, in which a large amount of current does not flow unlike in source electrode 14b, is connected to withdrawn conductor 15a via wire 13 including aluminum, for example. Moreover, source electrode 14b is connected to withdrawn conductor 15b via joining material 16b composed of a solder, for example. Drain electrode 14c formed at the rear surface side of semiconductor element 11 is connected to interconnection pattern 23 formed on the top surface of base plate 12, via joining material 16d composed of a solder, for example. Moreover, interconnection pattern 23 on the top surface of base plate 12 is connected to withdrawn conductor 15c via joining material 16c composed of a solder, for example.

Sealing resin 17 seals semiconductor element 11 disposed on base plate 12, portions of withdrawn conductors 15a to 15c, and the like. The outer peripheral end portions of withdrawn conductors 15a to 15c protrude relative to the outer peripheral portion of sealing resin 17 and are electrically connected to outside.

Next, the following describes respective configurations of the electrodes of semiconductor element 11. As shown in FIG. 2 to FIG. 4, semiconductor element 11 includes: semiconductor substrate 18; and an epitaxial layer 30 formed at the front surface (top surface) side of semiconductor substrate 18 by an epitaxial growth method. On epitaxial layer 30, gate electrode 14a and source electrode 14b are formed. An insulating layer 19 constituted of an organic protective film is formed to cover the outer peripheral portions of gate electrode 14a and source electrode 14b. As insulating layer 19, a polyimide film can be used, for example.

As shown in FIG. 3, a gate insulating film 21 is formed on the top surface of epitaxial layer 30. For example, gate electrode 14a is composed of polysilicon, and is formed on gate insulating film 21. Gate electrode 14a is formed simultaneously with a gate interconnection 22 located on gate insulating film 21. An interlayer insulating film 24 covers gate electrode 14a and gate interconnection 22. Above gate electrode 14a, an opening is formed in interlayer insulating film 24 and insulating layer 19 constituted of a polyimide film. A first metal portion 20a, which is an aluminum-based sputter film, is formed on gate electrode 14a. A nickel/gold multilayer is formed on first metal portion 20a as described below.

As shown in FIG. 4, a plurality of cell structures 25 are disposed on epitaxial layer 30 formed on the front surface of semiconductor substrate 18, at a region provided with source electrode 14b. As shown in FIG. 5, each cell structure 25 mainly includes gate insulating films 21, gate interconnections 22 and interlayer insulating films 24, which are formed on the front surface of epitaxial layer 30. FIG. 5 is a cross sectional view showing a structure in the vicinity of source electrode 14b (see FIG. 2), and illustrates a portion at the element surface side relative to epitaxial layer 30 on semiconductor substrate 18 (see FIG. 4). On the front surface of epitaxial layer 30, the plurality of gate insulating films 21 are disposed with an interval therebetween. The plurality of gate interconnections 22 are disposed on the respective surfaces of gate insulating films 21 with an interval therebetween. Gate interconnections 22 are covered with respective interlayer insulating films 24. It should be noted that each of gate interconnections 22 is connected to gate electrode 14a shown in FIG. 3. At a region between adjacent cell structures 25, an opening 27 is formed to allow for electric connection with underlying epitaxial layer 30. The inner circumferential side wall of opening 27 is constituted of the outer circumferential side walls of interlayer insulating films 24. On cell structures 25, first metal portion 20a to serve as source electrode 14b (see FIG. 2) is formed. A nickel/gold multilayer is formed on source electrode 14b.

In semiconductor element 11, semiconductor substrate 18 serves as a body region. Moreover, a body region 30e is formed in epitaxial layer 30 between adjacent gate interconnections 22. A source region 30f is formed in body region 30e so as to face opening 27. In opening 27, source region 30f is exposed. Source region 30f has n type conductivity, for example. It should be noted that when semiconductor element 11 is an IGBT, source region 30f is replaced with a collector region. Respective source regions 30f are formed between the plurality of cell structures 25 shown in FIG. 5.

Here, as shown in FIG. 5, a barrier layer 26 is formed between source electrode 14b (first metal portion 20a) and each of epitaxial layer 30 and interlayer insulating film 24. Barrier layer 26 has a function of preventing a diffused impurity, which comes from outside semiconductor element 11, from being diffused into epitaxial layer 30, interlayer insulating film 24, and gate interconnection 22. Examples of the impurity include an alkali metal. As shown in FIG. 5, barrier layer 26 is formed on the entire inner circumferential surface of opening 27. First metal portion 20a to serve as source electrode 14b (see FIG. 2) is layered on barrier layer 26.

First metal portion 20a is an aluminum film, for example. A recess 28 is provided in the upper surface of first metal portion 20a at a region located above opening 27. The upper surface is located opposite to the epitaxial layer 30 side. In recess 28, the area of the opening at the front surface of first metal portion 20a is equal to or more than the area of the bottom portion of the recess at the epitaxial layer 30 side. Insulating member 40 is formed to fill a portion of recess 28 of first metal portion 20a formed at the region above opening 27. Further, an intermediate layer 31 is formed on first metal portion 20a and insulating member 40. As intermediate layer 31, a nickel sputter film is formed, for example. A second metal portion 20b is formed on intermediate layer 31. As second metal portion 20b, an electroless nickel plating film is formed, for example. A portion of the upper surface of second metal portion 20b above opening 27 has a shape depressed relative to the other portions. A metal film 20c is formed on the upper surface of second metal portion 20b. As metal film 20c, an electroless gold plating film is formed, for example.

FIG. 6 is an enlarged cross sectional view of a structure in the vicinity of drain electrode 14c in semiconductor element 11. As shown in FIG. 6, drain electrode 14c (see FIG. 1) is formed at the rear surface side of semiconductor substrate 18. Drain electrode 14c may be a layered film. For example, when the material of semiconductor substrate 18 is silicon carbide (SiC), the following layered electrode may be formed as drain electrode 14c: a layered electrode in which nickel sputter films serving as a silicide layer 32, an intermediate layer 33, and a joining metal layer 34, and a gold sputter film serving as a surface oxidation preventing layer 35 are layered on the rear surface of semiconductor substrate 18 in this order. It should be noted that when semiconductor element 11 is an IGBT, drain electrode 14c is replaced with an emitter electrode.

<Function and Effect of Semiconductor Device>

The characteristic configurations of the semiconductor device described above are summarized as follows. A semiconductor element 11 serving as the above-described semiconductor device includes: a semiconductor substrate 18 having a main surface; a first gate interconnection 22 located at the left side of FIG. 5 and a second gate interconnection 22 located at the right side of FIG. 5; a first metal portion 20a; an insulating member 40; and a second metal portion 20b. First gate interconnection 22 and second gate interconnection 22 are disposed on the main surface of semiconductor substrate 18 with an interval between first gate interconnection 22 and second gate interconnection 22. First metal portion 20a is formed on first gate interconnection 22 and second gate interconnection 22. First metal portion 20a has a top surface located opposite to semiconductor substrate 18 at a region between first gate interconnection 22 and second gate interconnection 22. A recess 28 is formed in the top surface. Insulating member 40 fills at least a portion of recess 28. Second metal portion 20b extends from an upper surface of insulating member 40 onto the top surface of first metal portion 20a.

In this way, since insulating member 40 is disposed to fill at least a portion of recess 28, the depth of recess 28 from the upper opening thereof can be shallow, with the result that second metal portion 20b can extend without interruption from the upper surface of insulating member 40 in recess 28 onto the top surface of first metal portion 20a. That is, when forming second metal portion 20b on first metal portion 20a, a defect such as a void can be suppressed from being generated in second metal portion 20b. Moreover, since insulating member 40 is disposed in recess 28, occurrence of pitting corrosion or the like in recess 28 of first metal portion 20a can be suppressed even when etching or the like is performed as a pre-process for forming second metal portion 20b. As a result, a chemical liquid or the like used in the process of manufacturing the semiconductor device can be suppressed from remaining in the void, and occurrence of defects can be suppressed such as occurrence of a crack from the void in first metal portion 20a. Accordingly, a semiconductor device having high reliability can be obtained.

In semiconductor element 11, insulating member 40 may be a polymeric material. In this case, it is possible to employ such a process that a polymeric material in a liquid state is introduced into recess 28 and is then cured into insulating member 40 as described below. Accordingly, insulating member 40 can be securely disposed in recess 28, whereby a semiconductor device having high reliability can be obtained.

In semiconductor element 11, the polymeric material may include one of a photoresist and polyimide. In this case, since the photoresist or polyimide, which are industrially readily handled, is used as insulating member 40, insulating member 40 can be readily formed in recess 28.

In semiconductor element 11, insulating member 40 may be an inorganic material. In this case, since the inorganic material, such as a silicon oxide film, which is a general material for a conventional semiconductor device, is used as a material of insulating member 40, insulating member 40 can be formed using a conventional manufacturing apparatus for semiconductor devices.

In semiconductor element 11, the inorganic material may include one of a silicon oxide film and a silicon nitride film. In this case, since each of the silicon oxide film and the silicon nitride film is a general material for semiconductor element 11, insulating member 40 can be formed using a conventional manufacturing apparatus for semiconductor elements.

Semiconductor element 11 includes an intermediate layer 31 disposed between insulating member 40 and second metal portion 20b. In this case, a layer composed of a material excellent in adhesion with the metal of second metal portion 20b can be formed as intermediate layer 31. Accordingly, second metal portion 20b can be formed homogeneously, whereby the reliability of semiconductor element 11 can be improved.

In semiconductor element 11, intermediate layer 31 is a film including nickel. In semiconductor element 11, first metal portion 20a is an aluminum film. In semiconductor element 11, second metal portion 20b is an electroless nickel film. In this case, reliability can be improved in semiconductor element 11 in which the aluminum film and the electroless nickel film are formed as first metal portion 20a and second metal portion 20b.

In semiconductor element 11, insulating member 40 is disposed to fill a portion of recess 28 at the semiconductor substrate 18 side. Recess 28 includes a set of side walls facing each other. The set of side walls of recess 28 have portions 28c, 28d not covered with insulating member 40 and a distance between portions 28c, 28d of the set of side walls is larger in a direction away from insulating member 40.

In this case, portions 28c, 28d of the side walls of the recess not covered with insulating member 40 form a tapered shape in which its width becomes wider in a direction toward the upper side of recess 28, whereby occurrence of a void or the like can be suppressed when forming second metal portion 20b.

In semiconductor element 11, the set of side walls of recess 28 have other portions 28a, 28b covered with insulating member 40 and a distance between the other portions 28a, 28b of the set of side walls is larger in a direction toward semiconductor substrate 18. In this case, portions 28a, 28b of the side walls of recess 28 forming a so-called reverse tapered shape are buried in insulating member 40, thereby securely suppressing occurrence of a void or the like, which is considered to be generated when forming second metal portion 20b at the reverse tapered shape portion.

<Method for Manufacturing Semiconductor Device>

FIG. 7 is a flowchart for illustrating a method for manufacturing the semiconductor device. Each of FIG. 8 to FIG. 22 is a schematic cross sectional view for illustrating the method for manufacturing the semiconductor device shown in FIG. 7. With reference to FIG. 7 to FIG. 22, the following describes a manufacturing process for semiconductor element 11 according to the first embodiment.

As shown in FIG. 7, the manufacturing process for semiconductor element 11 shown in FIG. 1 to FIG. 6 includes: a substrate step (S10); a foundation forming step (S20); a recess filling step (S30); a seed layer forming step (S40) of forming a seed layer serving as an intermediate layer constituted of an electroless nickel plating film; an insulating layer forming step (S50) of forming an insulating layer for breakdown voltage; a rear surface metalizing step (S60); and a joining metal forming step (S70).

Figure 9:
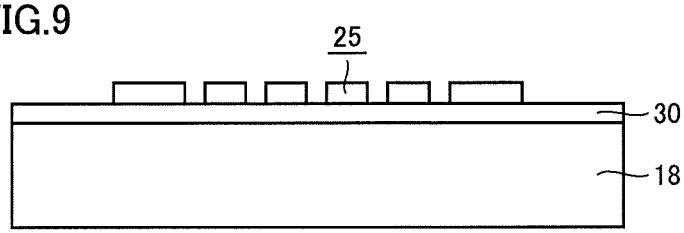
FIG. 9 is a schematic cross sectional view for illustrating the method for manufacturing the semiconductor device according to the first embodiment of the present invention.
Figure 10:
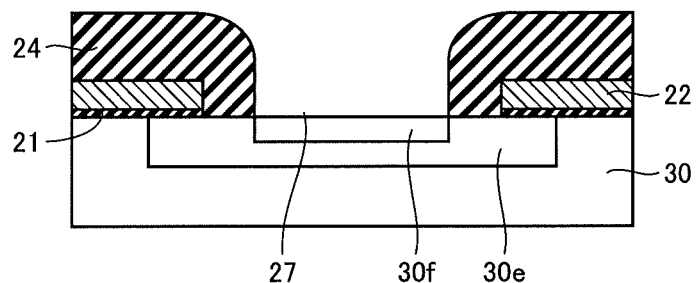
FIG. 10 is a schematic cross sectional view for illustrating the method for manufacturing the semiconductor device according to the first embodiment of the present invention.
Figure 11:
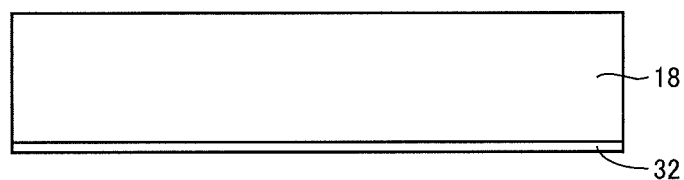
FIG. 11 is a schematic cross sectional view for illustrating the method for manufacturing the semiconductor device according to the first embodiment of the present invention.

First, in the substrate step (S10), a semiconductor element having a structure shown in FIG. 7 to FIG. 11 is prepared. Here, FIG. 8 shows a cross section at a region at which gate electrode 14a is formed in the semiconductor element prepared in the step (S10). FIG. 9 shows a cross section at a region at which source electrode 14b (first metal portion 20a) is formed in the semiconductor element prepared in the step (S10). FIG. 10 shows a cross section in the vicinity of opening 27 between adjacent cell structures 25 shown in FIG. 9 in the semiconductor element prepared in the step (S10). FIG. 11 shows a cross section in the vicinity of drain electrode 14c in the semiconductor element prepared in the step (S10). FIG. 8 to FIG. 11 respectively correspond to FIG. 3 to FIG. 6.

As understood from FIG. 8 to FIG. 11, in the step (S10), epitaxial layer 30, gate insulating film 21, gate electrode 14a, gate interconnection 22, and interlayer insulating film 24 are formed on the main surface of semiconductor substrate 18. Body region 30e and source region 30f are formed in epitaxial layer 30. Opening 27 is formed between gate interconnections 22 in interlayer insulating film 24. Silicide layer 32 is formed on the rear surface of semiconductor substrate 18.

In this step (S10), any conventionally well-known methods can be used for methods for forming semiconductor substrate 18, epitaxial layer 30, gate insulating film 21, gate electrode 14a, gate interconnection 22, and interlayer insulating film 24. As shown in FIG. 11, silicide layer 32 is formed on the rear surface of semiconductor substrate 18 as a joining layer for allowing for ohmic contact between drain electrode 14c (see FIG. 1) and semiconductor substrate 18. It should be noted that when SiC is used for the material of semiconductor substrate 18, silicide layer 32 described above is used. Silicide layer 32 can be formed by forming a metal film such as a nickel layer on the rear surface of semiconductor substrate 18 by the sputtering method or the like and performing heat treatment thereto, for example. Moreover, when laser annealing is used as the heat treatment to provide substantially no thermal damage to the structure at the front surface side of semiconductor substrate 18, the joining layer may be formed after forming the structure at the front surface side of semiconductor substrate 18. It should be noted that as such a joining layer, a film composed of a different material may be formed in conformity with the material of semiconductor substrate 18.

Moreover, as shown in FIG. 10, interlayer insulating film 24 has a corner portion that defines an upper opening of opening 27 and that is formed to have a curved shape. Any conventionally well-known method can be used for the method for forming the corner portion having the curved shape. It should be noted that the curvature of the corner portion having the curved shape may be varied due to an influence of variation in manufacturing process conditions.

Figure 12:
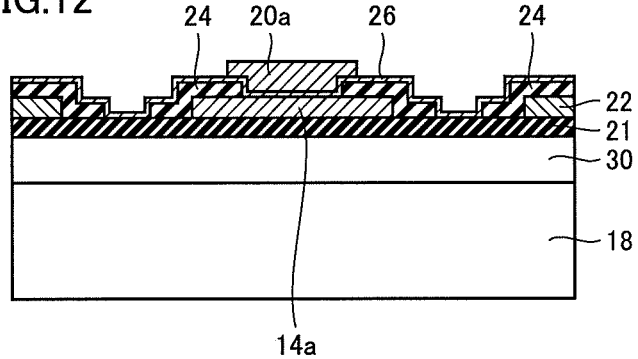
FIG. 12 is a schematic cross sectional view for illustrating the method for manufacturing the semiconductor device according to the first embodiment of the present invention.
Figure 13:
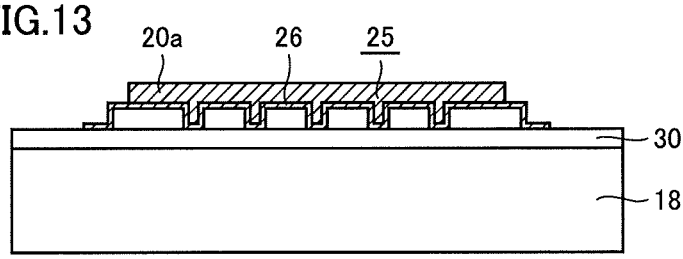
FIG. 13 is a schematic cross sectional view for illustrating the method for manufacturing the semiconductor device according to the first embodiment of the present invention.
Figure 14:
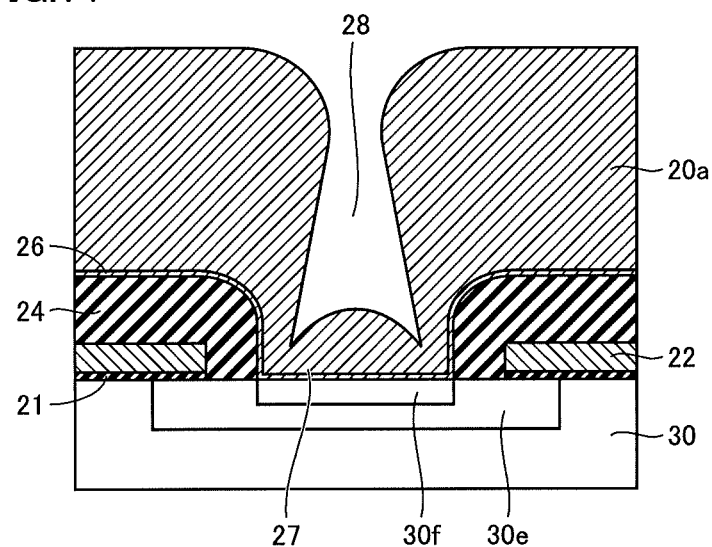
FIG. 14 is a schematic cross sectional view for illustrating the method for manufacturing the semiconductor device according to the first embodiment of the present invention.

Next, the foundation forming step (S20) is performed. In this step (S20), a structure shown in FIG. 12 to FIG. 14 is formed. FIG. 12 shows a cross section of the structure formed in the step (S20) at the region at which gate electrode 14a is formed. FIG. 13 shows a cross section of the structure formed in the step (S20) at the region at which source electrode 14b (first metal portion 20a) is formed. FIG. 14 shows a cross section of the structure formed in the step (S20) in the vicinity of opening 27 between adjacent cell structures 25 shown in FIG. 13. FIG. 12 to FIG. 14 respectively correspond to FIG. 3 to FIG. 5.

As shown in FIG. 12, in the step (S20) of forming a foundation for the electrodes, at the region at which gate electrode 14a is formed at the front surface side of semiconductor element 11, barrier layer 26 is formed to cover interlayer insulating film 24, a surface portion of gate electrode 14a exposed from the opening of interlayer insulating film 24, and a surface of gate insulating film 21. Moreover, first metal portion 20a is formed at a region located on barrier layer 26 and gate electrode 14a.

Moreover, as shown in FIG. 13 and FIG. 14, in the step (S20), at the region at which source electrode 14b is to be formed, barrier layer 26 is formed to cover the surface of interlayer insulating film 24 of cell structure 25 and the surface of epitaxial layer 30 exposed at the bottom of opening 27. Moreover, first metal portion 20a (see FIG. 2) to serve as source electrode 14b is formed on barrier layer 26 to cover the plurality of cell structures 25.

Barrier layer 26 can be formed by any conventionally well-known method. For example, barrier layer 26 is formed by a film forming step (S21) and a patterning step (S22). First metal portion 20a can be formed by any conventionally well-known method. For example, first metal portion 20a is formed by a film forming step (S23) and a patterning step (S24). In each of the film forming steps (S21, S23), the film to serve as barrier layer 26 or first metal portion 20a may be formed by the sputtering method, for example.

More specifically, for example, in the film forming step (S21), titanium (Ti), titanium nitride (TiN), or a composite film thereof is formed using the sputtering method to have a total film thickness of about more than or equal to 5 nm and less than or equal to 100 nm. By barrier layer 26, diffusion of an impurity element is suppressed between gate electrode 14a and first metal portion 20a, or between source region 30f and source electrode 14b (first metal portion 20a shown in FIG. 13 and FIG. 14), or between interlayer insulating film 24 and first metal portion 20a.

In the patterning step (S22), first, a photoresist is applied onto formed barrier layer 26. This photoresist is of positive type, for example. The film thickness of the applied photoresist is preferably in a range of about 0.3 µm to 1 µm.

Next, the applied photoresist is exposed to light. A region of the applied photoresist at which barrier layer 26 is to be removed by etching is exposed to light. In the case of the positive type photoresist, a photoresist portion having not been exposed to light remains in a development process. Then, barrier layer 26 is etched using the remaining photoresist as a mask. In this etching, for example, dry etching can be performed using carbon tetrafluoride ($CF_4$), trifluoromethane ($CHF_3$), or the like. After completing the etching, the photoresist used as the mask is removed using an organic solvent or oxygen plasma.

In the film forming step (S23), for example, a metal material containing Al is formed using the sputtering method to have a thickness of about more than or equal to 3 μm and less than or equal to 5 μm.

At the region at which first metal portion 20a serving as source electrode 14b is formed, there is a level difference between source region 30f and interlayer insulating film 24 as shown in FIG. 14. When the sputtering method is used in the film forming step (S23), sputtering may be performed at a high temperature or a heat treatment may be performed after the sputtering in order to attain improvement in filling the level difference in the sputtering film. In this heat treatment, the heat treatment temperature may be set to more than or equal to 350° C. and less than or equal to 500° C., for example. Conditions of the heat treatment such as the heat treatment temperature and heat treatment time can be determined in accordance with the shape of the level difference, the material of the sputtering film, and the like.

In the patterning step (S24), first, a photoresist is applied onto formed first metal portion 20a. This photoresist is of positive type, for example. The film thickness of the applied photoresist may be more than or equal to 6 μm and less than or equal to 8 μm in consideration of the level difference of first metal portion 20a, for example.

Next, the applied photoresist is exposed to light. A region of the applied photoresist at which first metal portion 20a is to be removed by etching is exposed to light. In the case of the positive type photoresist, a photoresist portion having not been exposed to light remains in a development process. Then, first metal portion 20a is etched using the remaining photoresist as a mask. This etching is performed using a mixed acid including sulfuric acid, acetic acid, and the like, for example. When silicon (Si) is included in first metal portion 20a, dry etching may be further performed using trifluoromethane ($CHF_3$) or the like in order to remove Si residue. After completing the etching, the photoresist used as the mask is removed using an organic solvent or oxygen plasma.

Here, FIG. 14 is an enlarged cross sectional view of the level difference portion formed between source region 30f and interlayer insulating film 24 at a region at which first metal portion 20a serving as source electrode 14b is formed. The shape of recess 28 formed in the top surface of first metal portion 20a depends on a device structure such as a pitch between adjacent gate interconnections 22, the film thickness or shape of interlayer insulating film 24, or the like. Moreover, the shape of recess 28 is influenced by manufacturing variations. Further, the curvature of the corner portion having the curved shape and located between the top surface and side surface of interlayer insulating film 24 may be also varied due to an influence of manufacturing conditions or the like. Accordingly, the shape formed by the side walls of recess 28 may become a reverse tapered shape as shown in FIG. 14. From a different viewpoint, it can be said that recess 28 formed in the top surface of first metal portion 20a includes a set of side walls facing each other and a distance between the side walls becomes smaller once and then becomes gradually larger in a direction from the upper end portion of the recess toward the bottom of the recess.

Figure 15:
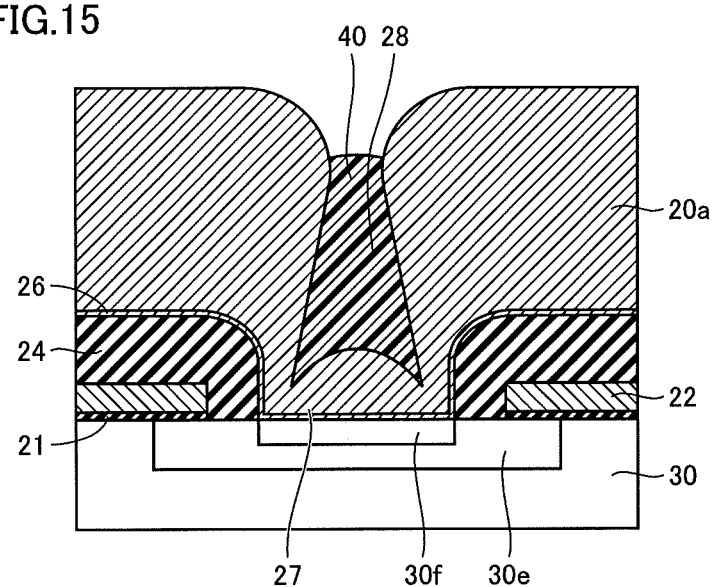
FIG. 15 is a schematic cross sectional view for illustrating the method for manufacturing the semiconductor device according to the first embodiment of the present invention.

Next, the filling step (S30) is performed. In this step (S30), as shown in FIG. 15, recess 28 is filled with insulating member 40. FIG. 15 is a schematic cross sectional view showing the filling step (S30) in semiconductor element 11 according to the first embodiment.

The filling step (S30) includes a film forming step (S31) and a patterning step (S32). As insulating member 40 to fill recess 28, an insulating film or a semi-insulating film is used, for example. Examples of the insulating film include a positive type photoresist, a polyimide film, and a TEOS oxide film. Examples of the semi-insulating film include a silicon nitride (SiN) film. The following describes each step in the case where the positive type photoresist is used as insulating member 40, for example.

In the film forming step (S31), the positive type photoresist is spin-coated onto the entire surface of semiconductor substrate 18 after performing the step (S20). As the positive type photoresist, for example, AZ-P4620 (provided by MERCK) is applied to the surface of the semiconductor substrate by way of spin coat at a rotating speed of 3000 rpm. Then, a vacuum defoaming process is performed. For conditions of the vacuum defoaming process, for example, a pressure of 50 KPa and a process time of 3 minutes can be employed. With this process, the photoresist is adhered to the inside of recess 28 of first metal portion 20a, particularly, the bottom side of recess 28. Then, calcination is performed at a heating temperature of 90° C. for a heating time of about more than or equal to 3 minutes and less than or equal to 4 minutes.

Next, the patterning step (S32) is performed. In this step (S32), the entire surface thereof is exposed to light and developed to remove the photoresist located on the upper surface of first metal portion 20a, i.e., the photoresist other than the photoresist in recess 28 of first metal portion 20a. For the exposure to light, a mercury lamp is used as a light source, for example. The mercury lamp emits exposing light (ultraviolet rays) having a center wavelength of 365 nm. As exposure conditions, light with more than or equal to 60% and less than or equal to 80% of a general light exposure amount (650 $mJ/cm^2$) may be emitted perpendicular to the surface of semiconductor substrate 18, or may be obliquely emitted such that the exposing light incidents on the surface of semiconductor substrate 18 at an inclination angle of more than or equal to 10° and less than or equal to 80°. Accordingly, the photoresist is removed from the surface of semiconductor substrate 18; however, the photoresist serving as insulating member 40 remains in recess 28 at first metal portion 20a on cell structures 25.

For developing conditions, a developing time is set to about 5 minutes when a TMAH-based liquid developer is used at a room temperature. Then, in a nitrogen atmosphere, hard baking is performed at a heating temperature of more than or equal to 230° C. and less than or equal to 280° C. for a heating time of more than or equal to 30 minutes and less than or equal to 60 minutes. As a result, chemical resistance of the photoresist can be secured. Here, by adjusting the film thickness of the applied photoresist, the thickness of the photoresist at the lower portion of recess 28 can be adjusted. It should be noted that also when a photosensitive polyimide is used as insulating member 40 serving as the filling material, insulating member 40 disposed in recess 28 can be formed by the same step.

Moreover, insulating member 40 filling recess 28 can also be composed of an inorganic film. For example, when a TEOS oxide film is used as insulating member 40, the TEOS oxide film is formed on the top surface of first metal portion 20*a* and in recess 28 using a plasma CVD method in the film forming step (S31). The film thickness of the TEOS oxide film can be more than or equal to 4 µm and less than or equal to 10 µm, for example. Then, as the patterning step (S32), the entire surface of semiconductor substrate 18 is dry-etched using $CF_4$. As a result, an unnecessary TEOS oxide film located on the top surface of first metal portion 20*a* is removed and the TEOS oxide film serving as insulating member 40 remains at the lower portion of recess 28. In this way, insulating member 40 constituted of the TEOS oxide film can be formed in recess 28. Further, also when a silicon nitride (SiN) film is used as insulating member 40 rather than the TEOS oxide film, insulating member 40 can be formed by the same step. It should be noted that when the SiN film is used as insulating member 40, the thickness of the film formed in the step (S31) may be set to more than or equal to 4 µm and less than or equal to 6 µm, for example.

Figure 16:
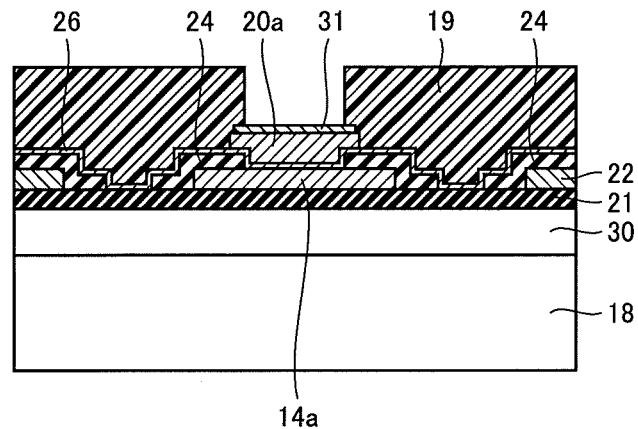
FIG. 16 is a schematic cross sectional view for illustrating the method for manufacturing the semiconductor device according to the first embodiment of the present invention.
Figure 17:
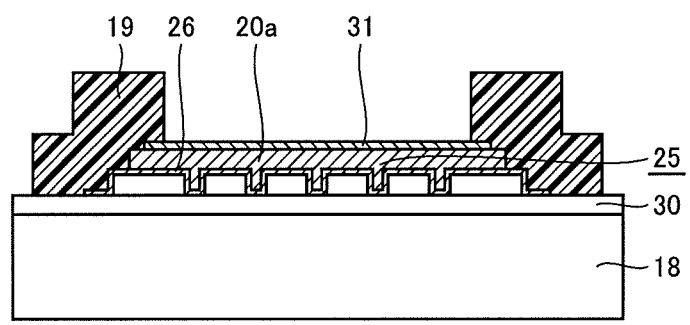
FIG. 17 is a schematic cross sectional view for illustrating the method for manufacturing the semiconductor device according to the first embodiment of the present invention.
Figure 18:
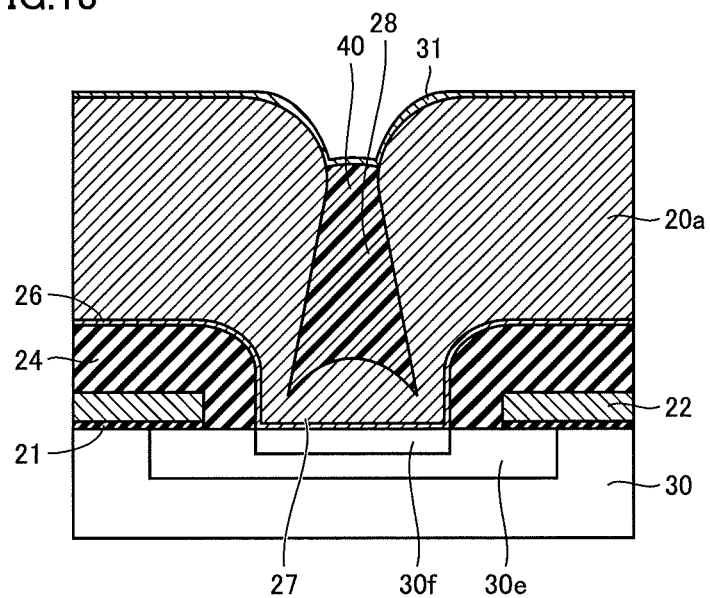
FIG. 18 is a schematic cross sectional view for illustrating the method for manufacturing the semiconductor device according to the first embodiment of the present invention.

Next, the seed layer forming step (S40) and the insulating layer forming step (S50) are performed. FIG. 16 and FIG. 17 show the following state: a seed layer composed of an electroless nickel plating film is formed in the step (S40) on the top surface of first metal portion 20*a* located on the front surface of semiconductor substrate 18, and then insulating layer 19 for breakdown voltage is formed in the step (S50). FIG. 16 and FIG. 17 correspond to FIG. 12 and FIG. 13. FIG. 18 shows a configuration after performing the step (S40) and the step (S50) in the vicinity of recess 28 of first metal portion 20*a*. FIG. 18 corresponds to FIG. 15. As shown in FIG. 18, since insulating member 40 is disposed to fill at least a portion of recess 28, the depth of recess 28 from the upper opening thereof can be shallow, with the result that the seed layer serving as intermediate layer 31 can be formed without interruption to extend from the upper surface of insulating member 40 in recess 28 onto the top surface of first metal portion 20*a*.

In the step (S40), as shown in FIG. 16 to FIG. 18, intermediate layer 31 is formed on first metal portion 20*a* at the front surface side of semiconductor substrate 18. At the region at which this intermediate layer 31 is formed, a joining metal film is formed to achieve connection to the outside of semiconductor element 11. The material of intermediate layer 31 is selected appropriately in accordance with manufacturing method and material for the metal film to be formed thereon.

In the seed layer forming step (S40), a nickel sputter film is formed as intermediate layer 31 by a mask sputtering method, for example. Specifically, there is prepared a metal mask provided with a hole in conformity with a portion at which the nickel layer serving as intermediate layer 31 is to be formed. Moreover, the thickness of the mask is about 0.1 mm, for example. The metal mask is fixed on the top surface of semiconductor substrate 18 with the metal mask and semiconductor substrate 18 being aligned with each other, and the nickel sputter film is formed by the sputtering method at a predetermined region of the surface of semiconductor substrate 18 via the hole of the metal mask.

This is due to the following reason: if the nickel layer is formed on the entire surface of semiconductor substrate 18 and then the nickel sputter film is partially removed to form a pattern using a general etching solution that can remove nickel, not only the nickel sputter film but also the aluminum film are etched by the etching solution. Since the aluminum film is also thus damaged by the etching, when other electrodes, such as first metal portion 20*a*, are composed of aluminum, the other electrodes are damaged. Therefore, in order to prevent the damage of the electrodes, the mask sputtering method in which the above etching is not performed is used.

Moreover, in the step (S40), the following step may be performed. That is, a resist pattern is formed in advance at a region at which the nickel sputter film is unnecessary, before nickel sputtering for forming the nickel sputter film to serve as intermediate layer 31. Then, the nickel sputter film is formed by the sputtering method on the resist pattern and at a region at which intermediate layer 31 is to be formed and which is exposed from the resist pattern. Then, an organic solvent is used to remove the resist pattern and the nickel sputter film formed on the resist pattern (lift-off method). As a result, intermediate layer 31 composed of the nickel sputter film is formed as shown in FIG. 16 to FIG. 18.

Next, the insulating layer forming step (S50) is performed. In this step (S50), insulating layer 19 is formed at a region between a guard ring at an outer peripheral portion of the element and first metal portion 20*a* formed on gate electrode 14*a* and source region 30*f*. As insulating layer 19, a film composed of polyimide is formed, for example.

The step (S50) may include an applying step (S51) and a pattern forming step (S52). For example, when forming insulating layer 19 using photosensitive polyimide, in the applying step (S51), the photosensitive polyimide is applied onto the surface of semiconductor substrate 18 uniformly in the plane by way of the spin coat method. The film thickness of the applied photosensitive polyimide can be more than or equal to 10 µm and less than or equal to 50 µm, for example. Then, the applied photosensitive polyimide is calcinated at a heating temperature of 90° C. for a heating time of 2 minutes, for example. Next, the pattern forming step (S52) is performed. In the step (S52), for example, by photolithography using ultraviolet rays as exposing light, a polyimide pattern is formed at the above-described region at which insulating layer 19 is to be formed. Then, for example, the polyimide pattern is completely sintered under curing conditions with a heating temperature of 350° C. and a heating time of 60 minutes. In this way, insulating layer 19 composed of polyimide can be formed. It should be noted that the film thickness of insulating layer 19 is preferably thicker than the total thickness of second metal portion 20*b* constituted of a below-described electroless nickel plating film and metal film 20*c* constituted of a gold plating film. For example, the thickness of insulating layer 19 can be more than or equal to 6 µm and less than or equal to 30 µm.

Figure 19:
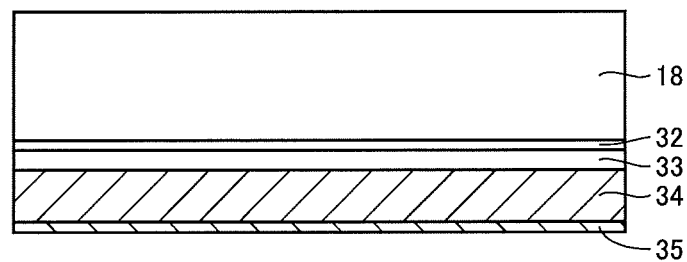
FIG. 19 is a schematic cross sectional view for illustrating the method for manufacturing the semiconductor device according to the first embodiment of the present invention.

Next, the rear surface metalizing step (S60) is performed. In this step (S60), the structure shown in FIG. 19 is formed. Specifically, in the step (S60), as shown in FIG. 19, intermediate layer 33, joining metal layer 34, and surface oxidation preventing layer 35 are formed on silicide layer 32 at the rear surface of semiconductor substrate 18. It should be noted that joining metal layer 34 and surface oxidation preventing layer 35 may be formed on silicide layer 32 without forming intermediate layer 33 as described below. For example, when semiconductor substrate 18 is a silicon carbide (SiC) substrate, a nickel sputter film serving as joining metal layer 34 and a gold sputter film serving as surface oxidation preventing layer 35 may be formed on silicide layer 32 in this order. In this case, for example, the film thickness of the nickel sputter film can be 1.5 µm and the film thickness of the gold sputter film can be 0.1 µm. From a different viewpoint, it can be said that the film thickness of surface oxidation preventing layer 35 may be thinner than the film thickness of joining metal layer 34. It should be noted that as intermediate layer 33, a titanium (Ti)

film or a multilayer structure (Ti/Al multilayer film) including titanium and aluminum may be formed.

When the electrodes on both the surfaces of semiconductor element 11 are constituted of plating films, a nickel sputter film having a film thickness of about 0.1 μm and serving as joining metal layer 34 may be formed on silicide layer 32 of the SiC substrate serving as semiconductor substrate 18, for example. Further, an aluminum-based sputter film having a film thickness of more than or equal to 1 μm and serving as a first layered film may be formed on joining metal layer 34. Further, a nickel sputter film having a film thickness of about 0.1 μm and serving as a second layered film may be formed on the first layered film. In this way, when forming the joining metal layer on the front electrode of semiconductor element 11 by a plating process in the below-described joining metal forming step (S70), a plating film serving as the joining metal layer can be simultaneously formed also on the rear surface of semiconductor element 11.

Further, as another structure, a copper sintered material can be formed on the rear surface of semiconductor substrate 18. In this case, the step (S60) is not performed. For example, the step (S40) is performed with silicide layer 32 being formed on the rear surface of semiconductor substrate 18 that is a SiC substrate. Then, after dry-etching the rear surface of semiconductor substrate 18, a titanium sputter film serving as intermediate layer 33 is formed. The film thickness of the titanium sputter film is 0.1 μm, for example. Next, an aluminum-based sputter film is formed as the first layered film. The film thickness of the aluminum-based sputter film is 0.4 μm, for example. A copper sputter film having a film thickness of 0.1 μm is formed thereon as the second layered film. Then, a paste or sheet material including copper particles is disposed on the copper sputter film and is sintered at a heating temperature of more than or equal to 250° C. and less than or equal to 350° C. for a heating time of several minutes under a nitrogen atmosphere or reducing atmosphere. It should be noted that during the sintering, a load of more than or equal to 10 MPa and less than or equal to 50 MPa may be applied to the paste or sheet material. As a result, a copper electrode having a thickness of more than or equal to 10 μm and less than or equal to 100 μm can be formed.

Figure 20:
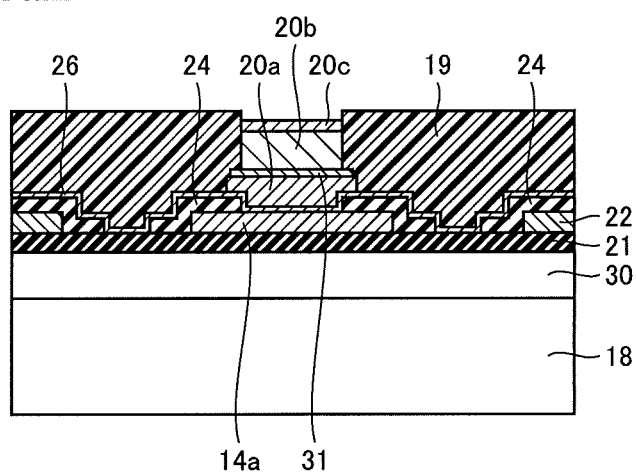
FIG. 20 is a schematic cross sectional view for illustrating the method for manufacturing the semiconductor device according to the first embodiment of the present invention.
Figure 21:
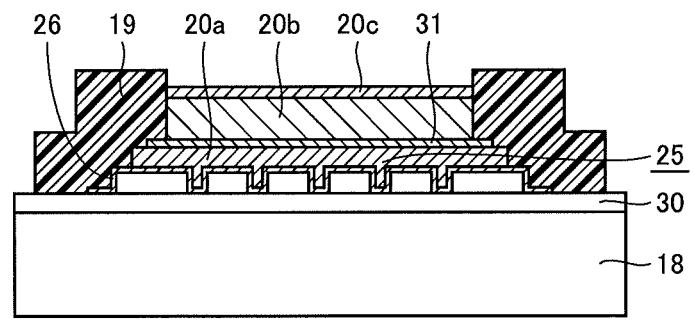
FIG. 21 is a schematic cross sectional view for illustrating the method for manufacturing the semiconductor device according to the first embodiment of the present invention.
Figure 22:
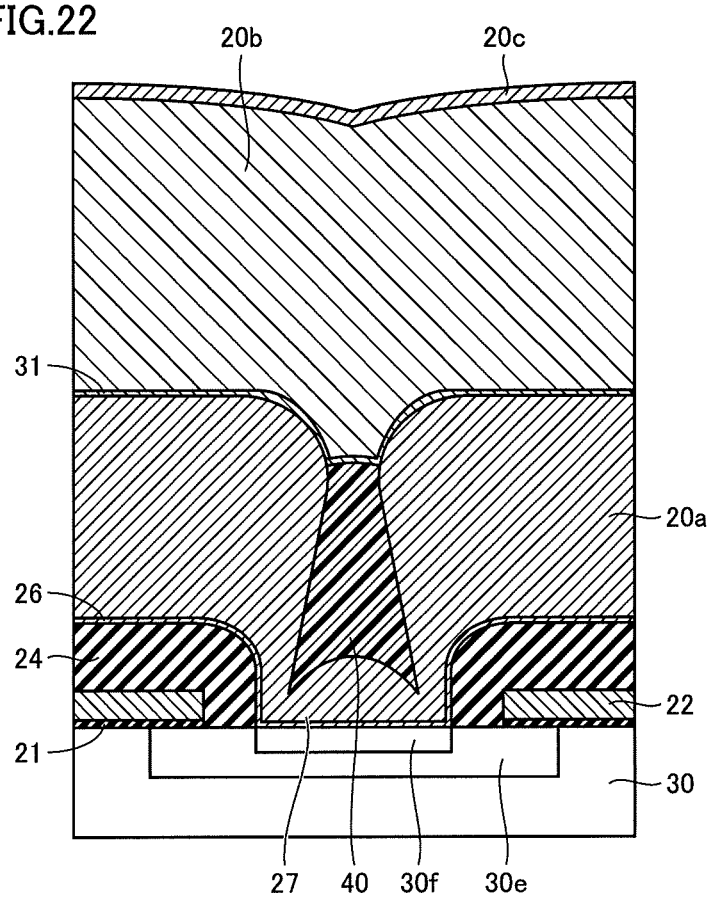
FIG. 22 is a schematic cross sectional view for illustrating the method for manufacturing the semiconductor device according to the first embodiment of the present invention.

Next, the joining metal forming step (S70) is performed. In this step (S70), a structure shown in FIG. 20 to FIG. 22 is formed. FIG. 20 shows a cross section of the structure formed in the step (S70) at the region at which gate electrode 14a is formed. FIG. 21 shows a cross section of the structure formed in the step (S70) at the region at which source electrode 14b (first metal portion 20a) is formed. FIG. 22 shows a cross section of the structure formed in the step (S70) in the vicinity of opening 27 between adjacent cell structures 25 shown in FIG. 21. FIG. 20 to FIG. 22 correspond to FIG. 3 to FIG. 5, respectively.

The step (S70) includes: a step (S72) of performing a pre-process for improving wettability of the region at which second metal portion 20b constituted of, for example, an electroless nickel plating film is to be formed, and performing a surface activation process onto intermediate layer 31 constituted of, for example, a nickel sputter film; and a step (S74) of forming an electroless nickel plating as second metal portion 20b and forming an electroless gold plating film as metal film 20c. The film thickness of second metal portion 20b may be more than or equal to 1 μm and less than or equal to 10 μm, for example. The film thickness of metal film 20c may be more than or equal to 10 nm and less than or equal to 100 nm, for example.

In the step (S72), as the step of improving the wettability and the step of performing the surface activation process, any conventionally well-known processes can be performed in accordance with the materials of intermediate layer 31 and second metal portion 20b. Moreover, as each of the methods for forming second metal portion 20b and metal film 20c, a conventionally well-known method such as the plating method can be used. As a result, as shown in FIG. 20 to FIG. 22, it is possible to obtain a structure in which second metal portion 20b and metal film 20c are formed on intermediate layer 31. In this way, semiconductor element 11 according to the present embodiment can be obtained.

It should be noted that since the step (S72) and the step (S74) are performed to the wafer form before splitting semiconductor substrate 18, various types of chemical liquids are also brought into contact with the rear surface of semiconductor substrate 18. Accordingly, the metal film, such as the nickel layer formed on the rear surface of semiconductor substrate 18, may be etched. In order to prevent this, the step (S70) may include: a step (S71) of protecting the rear surface of semiconductor substrate 18 using a protecting member such as a chemical-resistant protecting tape, before performing the step (S72); and a step (S75) of detaching the protecting member after performing the step (S74).

<Method for Manufacturing Semiconductor Module>

In a method for manufacturing the semiconductor module shown in FIG. 1, a preparing step (S100) is first performed. In this step, the components and materials of the semiconductor module are prepared, such as semiconductor element 11 prepared as described above as well as base plate 12, wire 13, withdrawn conductors 15a to 15c, joining materials 16b to 16d, and sealing resin 17, each of which is shown in FIG. 1.

Next, an assembling step (S200) is performed. In this step (S200), semiconductor element 11 is fixed on the upper surface of base plate 12, and withdrawn conductors 15a to 15c are connected to semiconductor element 11 or base plate 12 via wire 13 or joining materials 16b to 16d. Then, sealing resin 17 is formed to bury semiconductor element 11. For the manufacturing process used in the assembling step (S200), any conventionally well-known method can be used. In this way, the semiconductor module shown in FIG. 1 can be obtained.

<Function and Effect of Manufacturing Method>

According to the above-described method for manufacturing semiconductor element 11, even when the side walls of recess 28 formed in the front surface of first metal portion 20a form a reverse tapered shape, the side walls of recess 28 between the upper end of recess 28 and the upper surface of insulating member 40 does not form a reverse tapered shape and forms a general tapered shape (such a shape that a distance between the side walls facing each other becomes larger in the direction toward the upper end of recess 28) because insulating member 40 is formed in recess 28. Accordingly, the seed layer serving as intermediate layer 31 formed in recess 28 can be formed continuously without interruption. As a result, second metal portion 20b can be deposited uniformly on intermediate layer 31, with the result that no cavity (void) is formed in recess 28. This leads to reduction of a possibility of an alkali metal remaining in such a cavity due to the manufacturing process for semiconductor element 11 and a possibility of occurrence of cracking in first metal portion 20a from such a cavity.

Second Embodiment

Figure 23:
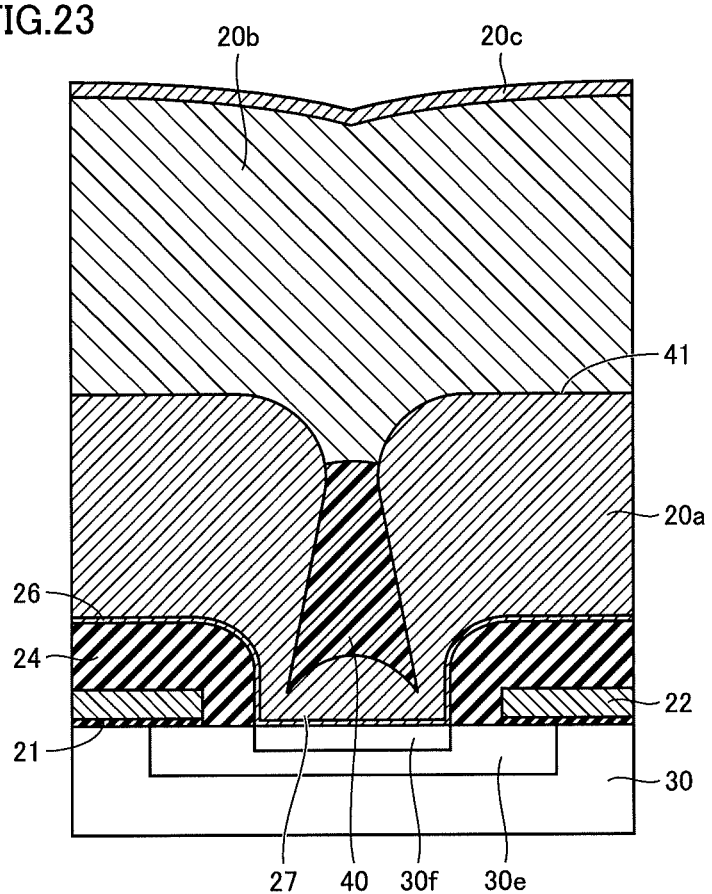
FIG. 23 is an enlarged schematic cross sectional view of a semiconductor device according to a second embodiment of the present invention.

<Configuration of Semiconductor Device>
FIG. 23 is an enlarged schematic cross sectional view of a semiconductor device according to a second embodiment of the present invention. The following describes a semiconductor element serving as the semiconductor device according to the present embodiment in comparison with semiconductor element 11 according to the first embodiment. The semiconductor element shown in FIG. 23 includes basically the same configuration as that of the semiconductor element shown in FIG. 1 to FIG. 6 but is different from semiconductor element 11 shown in FIG. 1 to FIG. 6 in that intermediate layer 31 shown in FIG. 5 is not formed between first metal portion 20a and second metal portion 20b.

That is, in opening 27 at source region 30f, the source electrode in semiconductor element 11 shown in FIG. 5 has a layered film structure including: barrier layer 26; first metal portion 20a constituted of an Al film; intermediate layer 31 constituted of a nickel sputter film; second metal portion 20b constituted of an electroless nickel plating film; and metal film 20c constituted of an electroless gold plating film. On the other hand, in the semiconductor element shown in FIG. 23, in opening 27 at source region 30f, the source electrode has a layered film structure including: barrier layer 26; first metal portion 20a constituted of an Al film; second metal portion 20b constituted of an electroless nickel plating film; and metal film 20c constituted of an electroless gold plating film. Thus, in the semiconductor element shown in FIG. 23, intermediate layer 31 (see FIG. 5) existing in semiconductor element 11 shown in FIG. 1 to FIG. 6 does not exist. That is, second metal portion 20b is in direct contact with the upper surface of first metal portion 20a and the upper surface of insulating member 40 in the recess. Also with such a configuration, the same effect as that for the semiconductor element shown in FIG. 1 to FIG. 6 can be obtained.

<Method for Manufacturing Semiconductor Device>
The following describes a manufacturing process for the semiconductor element shown in FIG. 23. The method for manufacturing the semiconductor element shown in FIG. 23 as the semiconductor device according to the present embodiment includes a substrate step (S10), a foundation forming step (S20), a recess filling step (S30), an insulating layer forming step (S50) of forming an insulating layer for breakdown voltage, a rear surface metalizing step (S60), and a joining metal forming step (S70). The respective steps above are basically the same as the corresponding steps in the method for manufacturing the semiconductor element according to the first embodiment shown in FIG. 7. However, in comparison with the method for manufacturing the semiconductor element in the first embodiment, the method for manufacturing the semiconductor element shown in FIG. 23 does not include the seed layer forming step (S40). Moreover, the step (S72) in the step (S70) is changed to an electroless nickel plating pre-process step (S73).

Hereinafter, the joining metal forming step (S70) will be more specifically described. In the step (S70) of the method for manufacturing the semiconductor element according to the first embodiment of the present invention, the step (S71) of protecting the rear surface of semiconductor substrate 18 using the protecting member such as a chemical-resistant protecting tape, the step (S72) of performing the pre-process for improving the wettability of the region at which second metal portion 20b is to be formed and performing the surface activation process onto intermediate layer 31, the step (S74) of forming second metal portion 20b and metal film 20c, and the step (S75) of detaching the protecting member, are performed in this order. On the other hand, in the step (S70) of the method for manufacturing the semiconductor element according to the second embodiment of the present invention, the step (S71) of protecting the rear surface of semiconductor substrate 18 using the protecting member such as a chemical-resistant protecting tape, the electroless nickel plating pre-process step (S73), the step (S74) of forming an electroless nickel plating serving as second metal portion 20b and metal film 20c, and the step (S75) of detaching the protecting member are performed in this order. It should be noted that regarding the respective film thicknesses of the films formed in the step (S74), the film thickness of the electroless nickel plating film serving as second metal portion 20b is more than or equal to 1 μm and less than or equal to 10 μm, and the film thickness of the electroless gold plating film serving as metal film 20c is more than or equal to 10 nm and less than or equal to 100 nm.

The following describes specific exemplary steps performed in the step (S73). When forming the electroless nickel plating film directly on the aluminum film, the following pre-process is performed before forming the electroless nickel plating film. Specifically, a degreasing cleaning step serving as a first step, an etching step serving as a second step, an acid cleaning step serving as a third step, a first zincate process step serving as a fourth step, an acid cleaning step serving as a fifth step, and a second zincate process step serving as a sixth step are performed. By repeatedly performing the zincate process twice, the electroless nickel plating film can be deposited more densely. It should be noted that a pure-water cleaning operation is performed between the first to sixth steps.

<Function and Effect>
According to the semiconductor element and the method for manufacturing the semiconductor element, it is possible to obtain the same effect as the effect obtained by the semiconductor element and the method for manufacturing the semiconductor element according to the first embodiment of the present invention. Further, in the semiconductor element according to the second embodiment, since insulating member 40 is provided in recess 28 of first metal portion 20a constituted of an aluminum film, first metal portion 20a in contact with the insulating member at the lower portion of recess 28 is not etched even when the first and second zincate process steps are performed. Accordingly, aluminum pitting corrosion reaching interlayer insulating film 24 is suppressed from being formed, and a cavity is suppressed from being formed in second metal portion 20b, which is a nickel plating film. That is, by providing a sufficient amount of the insulating film serving as insulating member 40 in recess 28 of first metal portion 20a, the same effect as that in the first embodiment can be obtained.

Moreover, by forming the electroless nickel plating film as second metal portion 20b after performing the zincate process as described above, adhesion of the plating film serving as second metal portion 20b to first metal portion 20a is increased due to an effect of forming irregularities in the surface of first metal portion 20a by the zincate process. Hence, in the present embodiment, a device can be formed which exhibit reliability equal to or more than that in the case where the electroless nickel plating film is formed on intermediate layer 31 as in the first embodiment of the present invention.

Although the embodiments of the present invention have been illustrated, the embodiments described above can be modified in various manners. Further, the scope of the present invention is not limited to the above-described embodiments. The scope of the present invention is defined by the terms of the claims, and is intended to include any modifications within the scope and meaning equivalent to the terms of the claims.

REFERENCE SIGNS LIST

10: semiconductor module; 11: semiconductor element; 12: base plate; 13: wire; 14a: gate electrode; 14b: source electrode; 14c: drain electrode; 15a, 15b, 15c: withdrawn conductor; 16b, 16c, 16d: joining material; 17: sealing resin; 18: semiconductor substrate; 19: insulating layer; 20a: first metal portion; 20b: second metal portion; 20c: metal film; 21: gate insulating film; 22: gate interconnection; 23: interconnection pattern; 24: interlayer insulating film; 25: cell structure; 26: barrier layer; 27: opening; 28: recess; 28a to 28d: portion; 30: epitaxial layer; 30e: body region; 30f source region; 31, 33: intermediate layer; 32: silicide layer; 34: joining metal layer; 35: surface oxidation preventing layer; 40: insulating member.

The invention claimed is:

1. A semiconductor device comprising:
a semiconductor substrate having a main surface;
a first gate interconnection and a second gate interconnection disposed on the main surface of the semiconductor substrate with an interval between the first gate interconnection and the second gate interconnection;
a first metal portion formed on the first gate interconnection and the second gate interconnection, the first metal portion having a top surface located opposite to the semiconductor substrate at a region between the first gate interconnection and the second gate interconnection, a recess being formed in the top surface;
an insulating member filling a portion of the recess; and
a second metal portion at least a portion of which is located in the recess, the second metal portion extending from an upper surface of the insulating member onto the top surface of the first metal portion.

2. The semiconductor device according to claim 1, wherein the insulating member is a polymeric material.

3. The semiconductor device according to claim 2, wherein the polymeric material includes one of a photoresist and polyimide.

4. The semiconductor device according to claim 1, wherein the insulating member is an inorganic material.

5. The semiconductor device according to claim 4, wherein the inorganic material includes one of a silicon oxide film and a silicon nitride film.

6. The semiconductor device according to claim 1, further comprising an intermediate layer disposed between the insulating member and the second metal portion.

7. The semiconductor device according to claim 6, wherein the intermediate layer is a film including nickel.

8. The semiconductor device according to claim 1, wherein the first metal portion is an aluminum film.

9. The semiconductor device according to claim 1, wherein the second metal portion is an electroless nickel film.

10. The semiconductor device according to claim 1, wherein
the insulating member is disposed to fill a portion of the recess at the semiconductor substrate side,
the recess includes a set of side walls facing each other, and
the set of side walls of the recess have portions not covered with the insulating member and a distance between the portions of the set of side walls is larger in a direction away from the insulating member.

11. The semiconductor device according to claim 10, wherein the set of side walls of the recess have other portions covered with the insulating member and a distance between the other portions of the set of side walls is larger in a direction toward the semiconductor substrate.

* * * * *